(12) United States Patent
Lee et al.

(10) Patent No.: US 12,349,489 B2
(45) Date of Patent: Jul. 1, 2025

(54) IMAGE SENSOR

(71) Applicant: SAMSUNG ELECTRONICS CO., LTD., Suwon-si (KR)

(72) Inventors: Yun Ki Lee, Hwaseong-si (KR); Jung-Saeng Kim, Seoul (KR); Hyungeun Yoo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 28 days.

(21) Appl. No.: 18/470,972

(22) Filed: Sep. 20, 2023

(65) Prior Publication Data
US 2024/0014235 A1 Jan. 11, 2024

Related U.S. Application Data

(63) Continuation of application No. 17/739,640, filed on May 9, 2022, now Pat. No. 11,784,202, which is a
(Continued)

(30) Foreign Application Priority Data

Jan. 11, 2019 (KR) .................. 10-2019-0003842

(51) Int. Cl.
H10F 39/00 (2025.01)
H10F 39/18 (2025.01)

(52) U.S. Cl.
CPC ....... H10F 39/8057 (2025.01); H10F 39/024 (2025.01); H10F 39/18 (2025.01);
(Continued)

(58) Field of Classification Search
CPC .... H10F 39/8057; H10F 39/024; H10F 39/18; H10F 39/807; H10F 39/811; H10F 39/803; H10F 39/813; H10F 39/805
See application file for complete search history.

(56) References Cited

U.S. PATENT DOCUMENTS 8,698,265 B2   4/2014  Yoon
8,890,273 B2  11/2014  Jangjian et al.
(Continued)

FOREIGN PATENT DOCUMENTS

CN    107785385 A    3/2018
JP    2010109295     5/2010
(Continued)

OTHER PUBLICATIONS

Notice of Allowance in Chinese Appln. No. 201911091800.8, mailed on Oct. 22, 2024, 6 pages (with English translation).

Primary Examiner — Tucker J Wright
(74) Attorney, Agent, or Firm — Fish & Richardson P.C.

(57) ABSTRACT

An image sensor includes a semiconductor layer including a first section and a second section, the semiconductor layer having a first surface and a second surface that face each other, a device isolation layer in the semiconductor layer and defining a plurality of pixels; a first grid pattern on the first surface of the semiconductor layer over the first section; and a light-shield pattern on the first surface of the semiconductor layer over the second section. A top surface of the first grid pattern is located at a first level, a top surface of the light-shield pattern is located at a second level, the first level is lower than the second level, and the first and second levels are defined with respect to the first surface of the semiconductor layer.

20 Claims, 14 Drawing Sheets

Related U.S. Application Data continuation of application No. 16/711,295, filed on Dec. 11, 2019, now Pat. No. 11,355,541.

(52) U.S. Cl.
CPC ..... *H10F 39/8053* (2025.01); *H10F 39/8063* (2025.01); *H10F 39/807* (2025.01); *H10F 39/811* (2025.01); *H10F 39/8037* (2025.01)

(56) References Cited

U.S. PATENT DOCUMENTS

| | | | |
|---|---|---|---|
| 9,219,092 | B2 | 12/2015 | Jangjian et al. |
| 9,412,775 | B2 | 8/2016 | Lin et al. |
| 9,455,288 | B2 | 9/2016 | Tsai et al. |
| 9,591,242 | B2 | 3/2017 | Chien et al. |
| 9,947,714 | B2 | 4/2018 | Lee et al. |
| 10,074,680 | B2 | 9/2018 | Tseng et al. |
| 10,128,291 | B2 | 11/2018 | Yanagita et al. |
| 10,134,792 | B2 | 11/2018 | Lee et al. |
| 11,302,733 | B2 | 4/2022 | Jang et al. |
| 2006/0187327 | A1 | 8/2006 | Mabuchi et al. |
| 2009/0020838 | A1 | 1/2009 | Lin et al. |
| 2010/0110271 | A1 | 5/2010 | Yanagita et al. |
| 2012/0086094 | A1 | 4/2012 | Watanabe |
| 2015/0264233 | A1 | 9/2015 | Chien et al. |
| 2016/0064441 | A1 | 3/2016 | Sasaki et al. |
| 2016/0141321 | A1 | 5/2016 | Hsieh et al. |
| 2017/0027267 | A1 | 2/2017 | Morgan |
| 2017/0053959 | A1 | 2/2017 | Hsieh et al. |
| 2017/0098675 | A1 | 4/2017 | Chen et al. |
| 2017/0278881 | A1 | 9/2017 | Hsu et al. |
| 2017/0301712 | A1 | 10/2017 | Ahn et al. |
| 2017/0309673 | A1 | 10/2017 | Wu et al. |
| 2018/0033820 | A1 | 2/2018 | Chen et al. |
| 2018/0040656 | A1 | 2/2018 | Jang et al. |
| 2018/0040661 | A1 | 2/2018 | Lee et al. |
| 2018/0166475 | A1 | 6/2018 | Chen et al. |
| 2018/0197903 | A1* | 7/2018 | Hsu ............... H10F 39/024 |
| 2018/0286908 | A1 | 10/2018 | Yamazaki et al. |

FOREIGN PATENT DOCUMENTS

| | | |
|---|---|---|
| JP | 2012084693 | 4/2012 |
| JP | 2013175494 | 9/2013 |
| JP | 2016096323 | 5/2016 |
| JP | 2017034499 | 2/2017 |
| JP | 2018019139 | 2/2018 |
| KR | 20180016699 | 2/2018 |
| WO | WO 2016103936 | 6/2016 |

* cited by examiner

IMAGE SENSOR

CROSS-REFERENCE TO RELATED APPLICATION

This is application is a continuation of U.S. application Ser. No. 17/739,640, filed May 9, 2022, which is a continuation of U.S. application Ser. No. 16/711,295, filed Dec. 11, 2019, now U.S. Pat. No. 11,355,541, and a claim of priority under 35 U.S.C. § 119 is made to Korean Patent Application No. 10-2019-0003842 filed on Jan. 11, 2019, in the Korean Intellectual Property Office, the entireties of which are hereby incorporated by reference.

BACKGROUND

The present inventive concepts relate to an image sensor, and more particularly to an image sensor with improved image quality.

An image sensor is a semiconductor device that transforms optical images into electrical signals. Image sensor may be classified into a charge coupled device (CCD) type and a complementary metal oxide semiconductor (CMOS) type. A CIS (CMOS image sensor) is understood as corresponding to a CMOS type image sensor. A CIS typically includes a plurality of two-dimensionally arranged pixels. Each of the pixels includes a photodiode (PD). The photodiodes serve to transform incident light into an electrical signal.

SUMMARY

Embodiments of the inventive concepts provide an image sensor having improved image quality.

Embodiments of the inventive concepts provide an image sensor having a semiconductor layer including a first section and a second section, the semiconductor layer having a first surface and a second surface that face each other; a device isolation layer in the semiconductor layer and defining a plurality of pixels; a first grid pattern on the first surface of the semiconductor layer over the first section; and a light-shield pattern on the first surface of the semiconductor layer over the second section. A top surface of the first grid pattern is located at a first level, a top surface of the light-shield pattern is located at a second level, the first level is lower than the second level, and the first and second levels are defined with respect to the first surface of the semiconductor layer.

Embodiments of the inventive concepts further provide an image sensor having a semiconductor layer including a first section and a second section around the first section; a device isolation layer in the semiconductor layer and defining a plurality of pixels; a grid pattern on the semiconductor layer over the first section, the grid pattern extending along the device isolation layer and including a first pattern; and a light-shield pattern on the semiconductor layer over the second section. A thickness of the first pattern is less than a thickness of the light-shield pattern. The first pattern covers a lateral surface of the light-shield pattern.

Embodiments of the present inventive concepts still further provide an image sensor having a semiconductor layer including a first section and a second section; a device isolation layer in the semiconductor layer and defining a plurality of pixels; a grid pattern on the semiconductor layer over the first section; and a light-shield structure on the semiconductor layer over the second section. A thickness of the grid pattern is less than a thickness of the light-shield structure.

Embodiments of the inventive concepts also provide an image sensor having a semiconductor layer including a first section and a second section, the semiconductor layer having a first surface and a second surface that face each other; a device isolation layer in the semiconductor layer and defining a plurality of pixels; a grid pattern on the first surface of the semiconductor layer over the first section, the grid pattern including a first pattern and a low-refractive index pattern on the first pattern; a light-shield pattern on the first surface of the semiconductor layer over the second section; and color filters on first pixels from among the plurality of pixels that are in the first section of the semiconductor layer. A thickness of the first pattern is less than a thickness of the light-shield pattern, and a refractive index of the low-refractive index pattern is less than refractive indexes of the color filters.

BRIEF DESCRIPTION OF THE DRAWINGS

The above noted and other features of the inventive concepts will be described hereinafter with reference to the accompanying drawings.

DETAILED DESCRIPTION

Example embodiments of the inventive concepts will now be described more fully with reference to the accompanying drawings.

It should be understood that the accompanying figures are intended to illustrate general characteristics of methods, structure and/or materials utilized in certain example embodiments and to supplement the written description hereinafter provided. These drawings are not however to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature. Also, it should be understood that when a first layer or element is hereinafter described as "disposed on" a second layer or element, or as being "on" a second layer or element, the first layer or element may be directly on the second layer or element, or an intervening layer(s) or element(s) may be between the first layer or element and the second layer or element.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
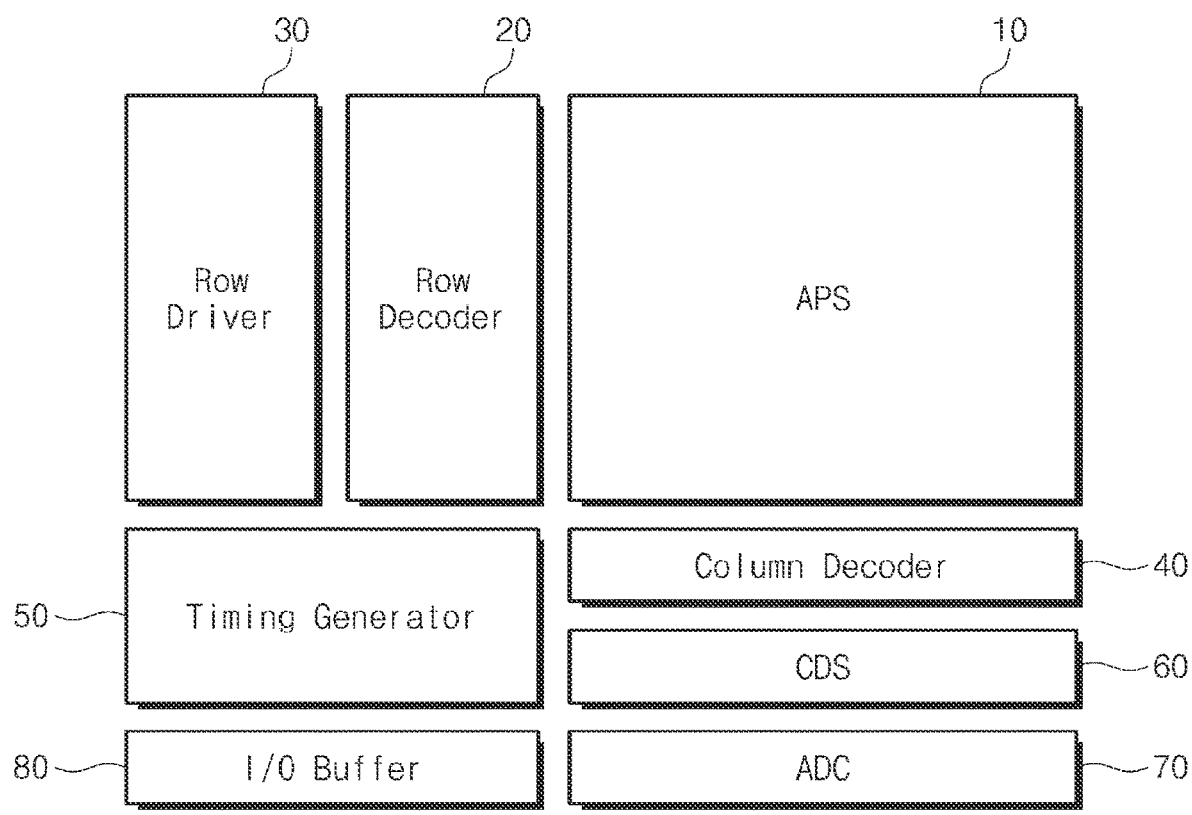
FIG. 1 illustrates a schematic block diagram of an image sensor according to embodiments of the inventive concepts.
Figure 2:
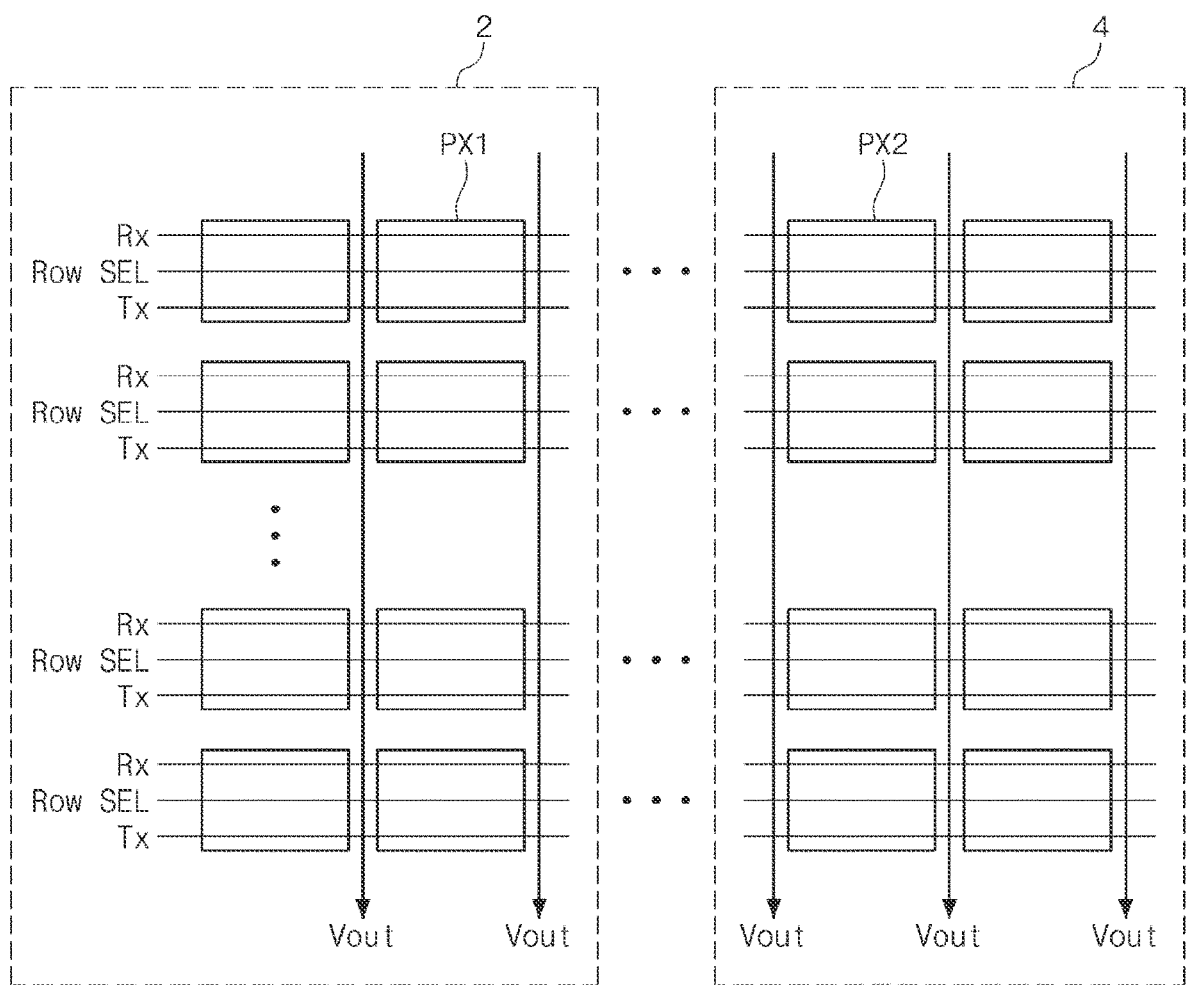
FIG. 2 illustrates a simplified circuit diagram of a sensor array of an image sensor according to embodiments of the inventive concepts.

FIG. 1 illustrates a schematic block diagram of an image sensor according to embodiments of the inventive concepts. FIG. 2 illustrates a simplified circuit diagram of a sensor array of an image sensor according to embodiments of the inventive concepts.

Referring to FIG. 1, an image sensor according to some example embodiments of the inventive concepts includes an active pixel sensor (APS) array 10, a row decoder 20, a row driver 30, a column decoder 40, a timing generator 50, a correlated double sampler (CDS) 60, an analog-to-digital converter (ADC) 70, and an input/output (I/O) buffer 80.

The APS array 10, as shown in FIG. 2, includes a first section 2 on which light is incident and a second section 4 on which light is not incident. The first and second sections 2 and 4 respectively include pixels PX1 and PX2 that are two-dimensionally arranged. The first section 2 has first pixels PX1 provided thereon which convert incident light into electrical signals. The second section 4 has second pixels PX2 provided thereon which may output electrical signals generated from pixels on which light is not incident. The first and second pixels PX1 and PX2 in the first and second sections 2 and 4 may be driven by a plurality of driving signals, such as row select signals Row SEL, reset signals Rx, and charge transfer signals Tx, provided from the row driver 30. The correlated double sampler 60 is provided with electrical signals generated from the APS array 10.

The row driver 30 provides the APS array 10 with several of the driving signals for driving several pixels in response to decoded results obtained from the row decoder 20. In the case that the pixels are arranged in a matrix shape, the driving signals may be provided for each row.

The timing generator 50 provides the row decoder 20 and the column decoder 40 with timing and control signals.

The correlated double sampler 60 receives the electrical signals generated from the APS array 10, and holds and samples the received electrical signals. The correlated double sampler 60 may perform a double sampling operation to sample a specific noise level and a signal level of the electrical signal, and outputs a difference level corresponding to a difference between the noise and signal levels.

The analog-to-digital converter 70 converts analog signals, which correspond to the difference level received from the correlated double sampler 60, into digital signals, and outputs the converted digital signals.

The input/output buffer 80 latches the digital signals and then sequentially outputs the latched digital signals to an image signal processor (not shown) in response to decoded results obtained from the column decoder 40.

Figure 3:
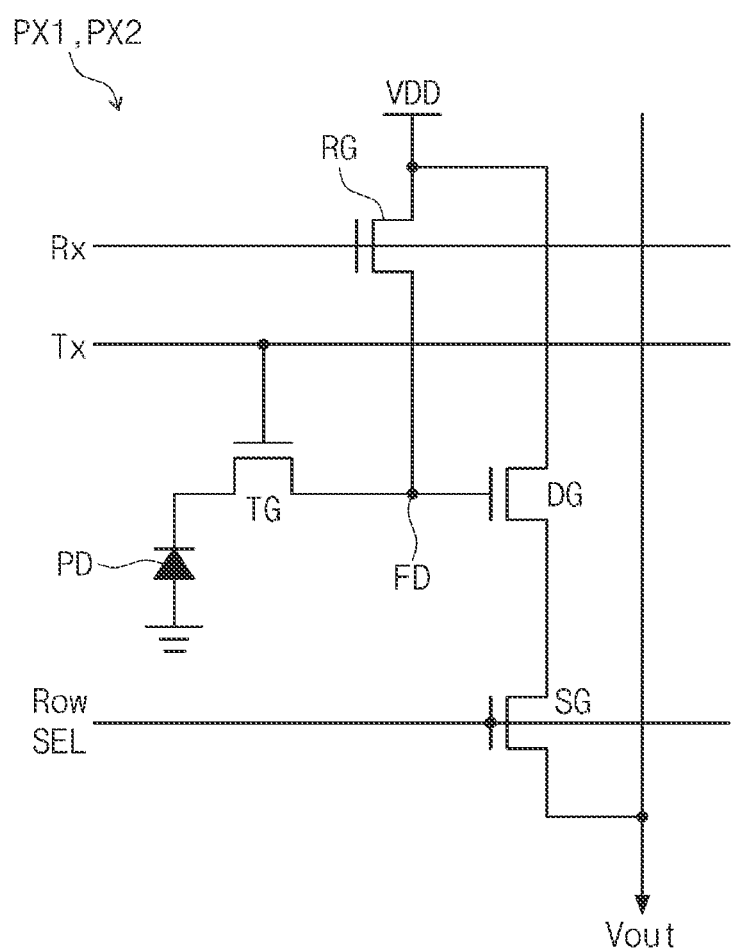
FIG. 3 illustrates a circuit diagram of pixels of an image sensor according to embodiments of the inventive concepts.

FIG. 3 illustrates a circuit diagram of pixels of an image sensor according to embodiments of the inventive concepts.

Referring to FIG. 3, the first and second pixels PX1 and PX2 include photoelectric conversion devices PD that convert incident light into electrical signals, and also include reading devices that read the electrical signals generated from the photoelectric conversion devices PD. The reading devices as shown in FIG. 3 include a transfer gate TG, a reset device RG, a drive device DG, and a select device SG. Driving signals (e.g., the charge transfer signal TX, the reset signal Rx, and row select signal Row SEL) of the transfer gate TG, the reset device RG, and the select device SG are connected in common to pixels included in the same row. Hereinafter, a single photoelectric conversion device PD will be described.

The photoelectric conversion device PD generates and accumulates photo-charges corresponding to an amount of externally incident light. For example, the photoelectric conversion device PD may include one of a photodiode, a phototransistor, a photogate, a pinned photodiode (PPD), and a combination thereof. The photoelectric conversion device PD is connected to the transfer gate TO. The transfer gate TG transfers the accumulated charges to a floating diffusion region FD.

The floating diffusion region FD receives the accumulated charges generated in the photoelectric conversion device PD. The floating diffusion region FD may have parasitic capacitance and thus may accumulatively store the charges. The floating diffusion region FD may have electrical connection with and may control the drive device DG.

The transfer gate TG transfers charges from the photoelectric conversion device PD to the floating diffusion region FD. The transfer gate TG may consist of one device and may be controlled responsive to the charge transfer signal Tx.

The reset device RG periodically resets the floating diffusion region FD and may be controlled responsive to the reset signal Rx. The reset device RG includes a source connected to the floating diffusion region FD and a drain connected to a power voltage VDD. When the reset signal RX turns on the reset device RG, the floating diffusion region FD is provided with the power voltage VDD connected to the drain of the reset device RG.

The drive device DG as combined with a constant current source (not shown) serves as a source follower amplifier, amplifying a variation in potential of the floating diffusion region FD that receives photo-charges accumulated in the photoelectric conversion device PD. The drive device DG outputs the amplified potential to an output line Vout.

The select device SG serves to select each row of the pixels to be readout. The select device SG may be driven by the row select signal Row SEL, and when turned on, the power voltage VDD connected to a drain of the select device SG is transferred to a drain of the drive device DG.

FIO. 4 illustrates a plan view of an image sensor according to embodiments of the inventive concepts. FIG. 5 illustrates a cross-sectional view taken along lines I-I' and II-II' of FIG. 4, showing an image sensor according to embodiments of the inventive concepts.

Figure 4:
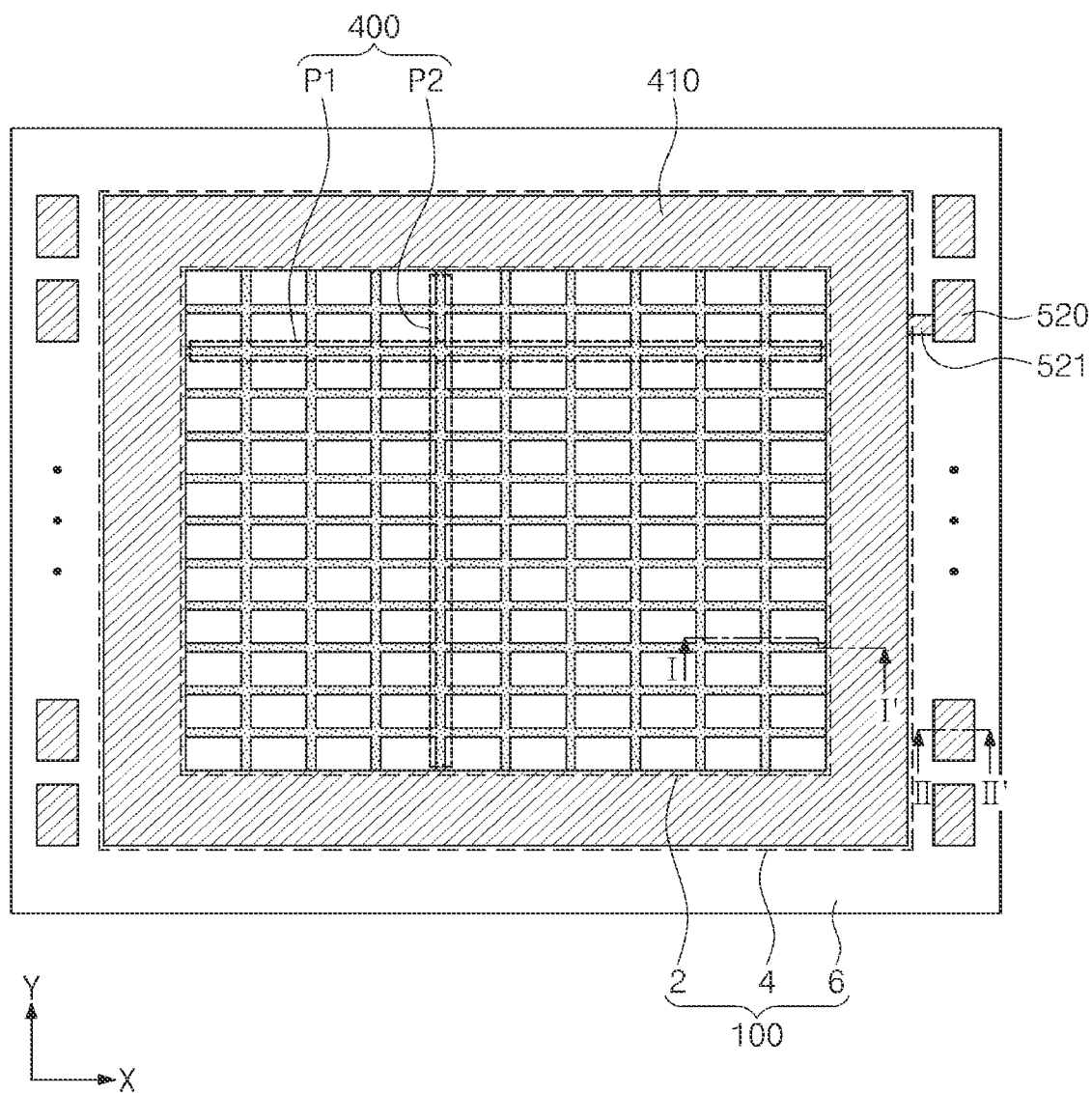
FIG. 4 illustrates a plan view of an image sensor according to embodiments of the inventive concepts.
Figure 5:
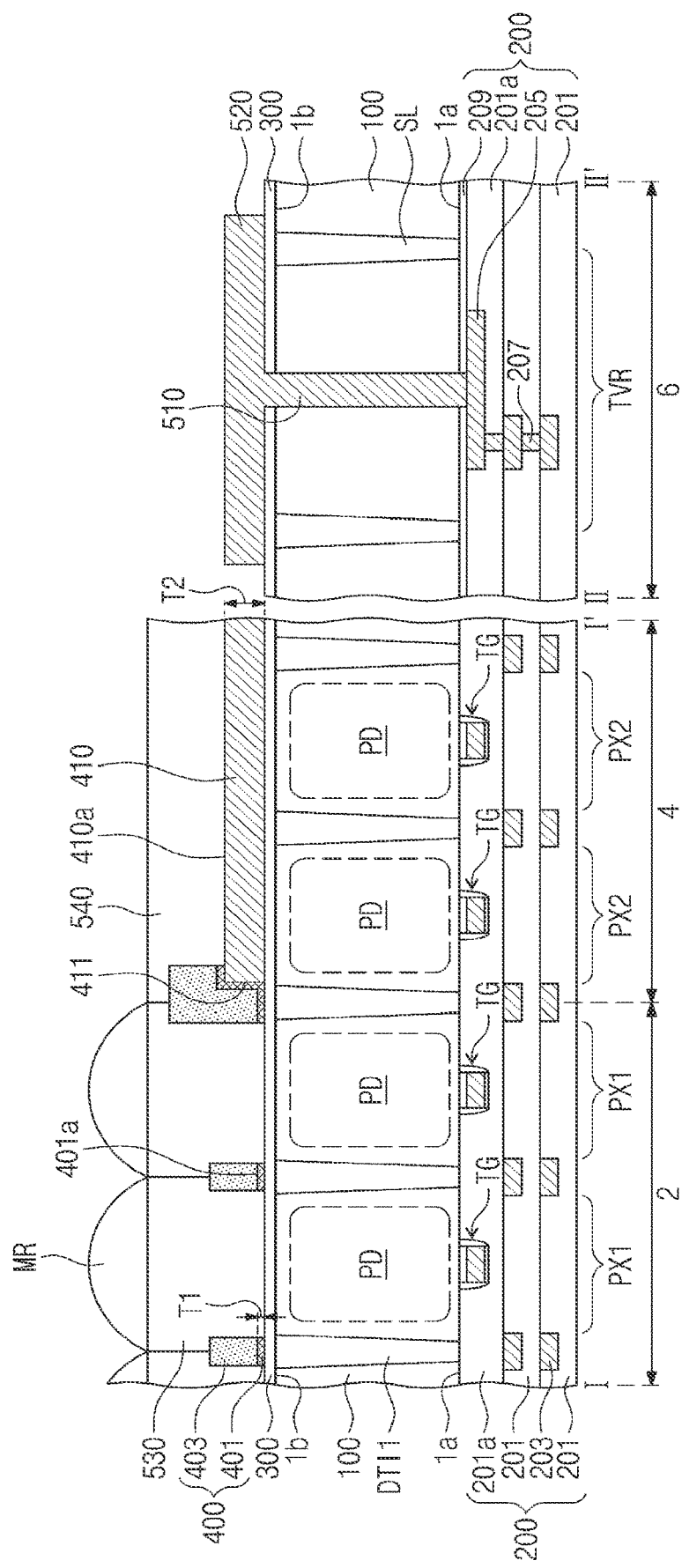
FIG. 5 illustrates a cross-sectional view taken along lines I-I' and II-II' of FIG. 4, showing an image sensor according to embodiments of the inventive concepts.

Referring to FIGS. 4 and 5, a semiconductor layer 100 includes a first section 2, a second section 4, and a third section 6. The second section 4 may be positioned around the first section 2 of the semiconductor layer 100, and the third section 6 may be positioned around the second section 4 of the semiconductor layer 100. For example, the first section 2 is a light-receiving region, the second section 4 is a light-shielding region, and the third section 6 is an input/output region. The semiconductor layer 100 may be, for example, a silicon semiconductor layer, a germanium semiconductor layer, a silicon-germanium semiconductor layer, a II-VI group compound semiconductor layer, a III-V group compound semiconductor layer, or a silicon-on-insulator (SOI) semiconductor layer. The semiconductor layer 100 has a first surface 1a and a second surface 1b. The first and second surfaces 1a and 1b may face each other.

A first device isolation layer DTI1 is provided in the first and second sections 2 and 4 of the semiconductor layer 100. The first device isolation layer DTI1 may penetrate the semiconductor layer 100. For example, the first device isolation layer DTI1 may have a first surface coplanar with the first surface 1a of the semiconductor layer 100, and may also have a second surface, which is opposite to the first surface of the first device isolation layer DTI1, coplanar with the second surface 1b of the semiconductor layer 100. The first device isolation layer DTI1 may be in contact with a lowermost one 201a of interlayer dielectric layers 201 and 201a included in a wiring structure 200, which will be described hereinafter. The first device isolation layer DTI1 defines first pixels PX1 and second pixels PX2 of the semiconductor layer 100. The first pixels PX1 are provided in the first section 2 of the semiconductor layer 100, and the second pixels PX2 are provided in the second section 4 of the semiconductor layer 100. The first device isolation layer DTI1 may include, for example, one or more of a silicon oxide layer, a silicon nitride layer, a dielectric layer such as AlO$_2$ or HfO$_2$, a semiconductor material such as polysilicon, and a metallic material such as tungsten, copper, or aluminum.

A protective isolation layer SL is provided in the third section 6 of the semiconductor layer 100. The protective isolation layer SL may penetrate the semiconductor layer 100. For example, the protective isolation layer SL may have a first surface coplanar with the first surface 1a of the semiconductor layer 100, and also may have a second surface, which is opposite to the first surface of the protective layer SL, coplanar with the second surface 1b of the semiconductor layer 100. The protective isolation layer SL may be in contact with a wiring dielectric layer 209, which will be described hereinafter. The protective isolation layer SL defines a through via region TVR in the third section 6 of the semiconductor layer 100. The protective isolation layer SL may have a polygonal or circular ring shape. Alternatively, the protective isolation layer SL may have a polygonal or circular shaped grid structure. The protective isolation layer SL may include one or more of a silicon nitride layer, a tantalum oxide layer, and a hafnium oxide layer.

Photoelectric conversion devices PD are disposed in the first and second pixels PX1 and PX2 of the semiconductor layer 100. The photoelectric conversion devices PD may be arranged spaced apart in a first direction X and a second direction Y intersecting the first direction X. The photoelectric conversion devices PD in the first section 2 of the semiconductor layer 100 may individually receive light incident on the second surface 1b of the semiconductor layer 100. The photoelectric conversion devices PD may include, for example, n-type impurities.

A wiring structure 200 is disposed on the first surface 1a of the semiconductor layer 100. The wiring structure 200 includes interlayer dielectric layers 201 and 201a, first connection lines 203, second connection lines 205, vias 207, transfer gates TG, and a wiring dielectric layer 209. The interlayer dielectric layers 201 and 201a are sequentially stacked on the first surface 1a of the semiconductor layer 100. The interlayer dielectric layers 201 and 201a may include, for example, a silicon oxide layer or a silicon nitride layer. The first and second connection lines 203 and 205 may be respectively disposed in the interlayer dielectric layers 201 and 201a. The first connection lines 203 are disposed over the first and second sections 2 and 4 of the semiconductor layer 100. The second connection lines 205 are disposed over the third section 6 of the semiconductor layer 100. One of the second connection lines 205 that is closer to the semiconductor layer 100 than any other second connection line 205 is provided on the wiring dielectric layer 209. The first and second connection lines 203 and 205 may include a metallic material, such as copper or tungsten for example. The vias 207 are provided over the third section 6 of the semiconductor layer 100. The vias 207 may be disposed in the interlayer dielectric layers 201 and 201a. The vias 207 may connect the second connection lines 205 to each other. Although not shown, vias such as vias 207 may also be disposed over the first and second sections 2 and 4 of the semiconductor layer 100. The vias 207 may include a metallic material, such as copper or tungsten.

The transfer gates TG are disposed on the first surface 1a of the semiconductor layer 100. The transfer gates TG are provided over the first and second sections 2 and 4 of the semiconductor layer 100. The transfer gates TG may be arranged to correspond to the photoelectric conversion devices PD of the first and second pixels PX1 and PX2. The transfer gates TG are covered with a lowermost interlayer dielectric layer 201a most adjacent to the first surface 1a of the semiconductor layer 100. The wiring dielectric layer 209 is interposed between the lowermost interlayer dielectric layer 201a and the first surface 1a over the third section 6 of the semiconductor layer 100. The wiring dielectric layer 209 covers the first surface 1a on the third section 6 of the semiconductor layer 100. The wiring dielectric layer 209 may include, for example, a silicon oxide layer, a silicon nitride layer, a silicon oxynitride layer, or a thermal oxide layer. In other embodiments, the wiring dielectric layer 209 is not provided. In such other embodiments, an interlayer dielectric layer 201 may be provided between the first surface 1a of the semiconductor layer 100 and the second connection line 205 adjacent to the first surface 1a of the semiconductor layer 100.

An anti-reflection layer 300 is disposed on the second surface 1b of the semiconductor layer 100. The anti-reflection layer 300 is provided over the first, second, and third sections 2, 4, and 6 of the semiconductor layer 100. The anti-reflection layer 300 over the third section 6 of the semiconductor layer 100 electrically insulates the semiconductor layer 100 from a pad 520, which will be described hereinafter. The anti-reflection layer 300 may include, for example, a silicon oxide layer, a silicon nitride layer, a silicon oxynitride layer, or a high-k dielectric layer such as a hafnium oxide layer and an aluminum oxide layer.

A grid pattern 400 is disposed on the anti-reflection layer 300. For example, the grid pattern 400 may be disposed on the second surface 1b over the first section 2 of the semiconductor layer 100. The grid pattern 400 may overlap and extend along the first device isolation layer DTI1. The grid pattern 400 includes first segments P1 and second segments P2. The first segments P1 extend in the first direction X and are spaced apart from each other in the second direction Y. The second segments P2 extend in the second direction Y and are spaced apart from each other in the first direction X. The first and second segments P1 and P2 are connected to a light-shield pattern 410, which will be described hereinafter. The grid pattern 400 may have a polygonal shaped grid structure.

The grid pattern 400 exposes the photoelectric conversion devices PD disposed in the first pixels PX1 of the semiconductor layer 100. The grid pattern 400 may consist of a plurality of layers. The grid pattern 400 may include a first grid pattern 401 (which may hereinafter be referred to as a first pattern 401) and a second grid pattern 403 (which may hereinafter ne referred to as a second pattern 403) that are sequentially stacked on the anti-reflection layer 300. The first pattern 401 may include a conductive material. For example, the first pattern 401 may include one or more of metal and conductive metal nitride. The first pattern 401 may for example include one or more of titanium (Ti), titanium nitride (TiN), tungsten (W), aluminum (Al), and copper (Cu). The first pattern 401 may have a first thickness T1 of about 100 Å to about 1500 Å. The second pattern 403 is disposed on the first pattern 401. The second pattern 403 may include an organic material. The second pattern 403 may include a material having a refractive index less than refractive indexes of color filters 530, which will be described hereinafter. The second pattern 403 may include a low-refractive material with a refractive index equal to or less than about 1.4. The second pattern 403 may have a thickness greater than the first thickness T1 of the first pattern 401.

A light-shield pattern 410 is disposed on the anti-reflection layer 300. For example, the light-shield pattern 410 may be placed on the second surface 1b over the second section 4 of the semiconductor layer 100. The light-shield pattern 410 may completely cover the second section 4 of the semiconductor layer 100. For example, the light-shield pattern 410 may cover the photoelectric conversion devices PD disposed in the second pixels PX2 of the semiconductor layer 100. The grid pattern 400 may cover a lateral surface 411 of the light-shield pattern 410. In certain embodiments, the first pattern 401 of the grid pattern 400 may cover the lateral surface 411 of the light-shield pattern 410 and be in contact with the light-shield pattern 410. The grid pattern 400 may cover the lateral surface 411 and the adjacent portion of a top surface 410a of the light-shield pattern 410. For example, the grid pattern 400 may extend from over the first section 2 to over the second section 4 of the semiconductor layer 100. In other embodiments, the grid pattern 400 may cover a portion of the lateral surface 411 of the light-shield pattern 410 and expose the top surface 410a of the light-shield pattern 410.

The light-shield pattern 410 may consist of a single layer. The light-shield pattern 410 may have a second thickness T2 of about 1500 Å to about 5000 Å. The second thickness T2 of the light-shield pattern 410 may be greater than the first thickness T1 of the first pattern 401 (T2>T1). The top surface 410a of the light-shield pattern 410 may be located at a first level that is higher than a second level of the top surface 401a of the first pattern 401. The first and second levels are respective distances from the second surface 1b of the semiconductor layer 100, or in other words the first and second levels are defined or taken as with respect to the second surface 1b of the semiconductor layer 100. For example, a distance between a top surface of the first pattern 401 and the second surface 1b of the semiconductor layer 100 is smaller than a distance between the top surface 410a of the light-shield pattern 410 and the second surface 1b of the semiconductor layer 100. The light-shield pattern 410 may include a metallic material, such as tungsten (W) for example.

Through vias 510 are provided in the third section 6 of the semiconductor layer 100. For example, each of the through vias 510 may be disposed in the through via region TVR of the semiconductor layer 100. As another example, a plurality of through vias 510 may be disposed in the through via region TVR of the semiconductor layer 100. The through vias 510 may penetrate the semiconductor layer 100, the anti-reflection layer 300, and the wiring dielectric layer 209 and have connection with the second connection lines 205 of the wiring structure 200. Pads 520 are provided over the third section 6 of the semiconductor layer 100. For example, the pads 520 may be disposed on the anti-reflection layer 300 placed on the second surface 1b over the third section 6 of the semiconductor layer 100. The pads 520 may be electrically insulated from each other. The pads 520 may be disposed on and connected to the through vias 510. Each of the through vias 510 and a corresponding overlying one of the pads 520 may be integrally combined into a single body.

In certain embodiments, at least one of the pads 520 may be connected to the light-shield pattern 410. As shown in FIG. 4 for example, in some embodiments at least one of the pads 520 may extend along the first direction X at 521 to be physically and/or electrically connected to the light shield pattern 410. Accordingly, the at least one of the pads 520 may be physically and/or electrically connected through the light-shield pattern 410 to the grid pattern 400. The grid pattern 400 connected to the at least one of the pads 520 may be connected through the through via 510 to the second connection line 205. In other embodiments, the pads 520 may be physically and/or electrically spaced apart from the light-shield pattern 410 and the grid pattern 400. In such other embodiments, the pads 520 are not physically and/or electrically connected to the light-shield pattern 410. The light-shield pattern 410 connected to the grid pattern 400 may be electrically connected by way of through vias (not shown), which are provided in the second section 4 of the semiconductor layer 100, to the second connection lines 205 of the wiring structure 200 and/or to the first connection lines 203 of the wiring structure 200 disposed over the second section 4 of the semiconductor layer 100.

The grid pattern 400 may serve as a pathway through which externally introduced electrostatic discharge is exhausted out of the active pixel sensor array 10. For example, electrostatic discharge may be released to the second connection lines 205 through the grid pattern 400, the light-shield pattern 410, at least one of the pads 520, and the through via 510 connected to the at least one of the pads 520. As another example, electrostatic discharge may be released to the first connection lines 203 and/or the second connection lines 205 through the grid pattern 400, the light-shield pattern 410, and the through vias (not shown). In this case, a ground voltage or a negative voltage may be applied to the first connection lines 203 and/or the second connection lines 205.

According to some example embodiments of the inventive concepts, the grid pattern 400 may have a stack structure different from that of the light-shield pattern 410. The first pattern 401 of the grid pattern 400 may include a metallic material that is thinner than the light-shield pattern 410, and as a result, may minimize light absorption while serving as a pathway through which electrostatic discharge is exhausted out. The second pattern 403 of the grid pattern 400 may include a low-refractive material, and thus may refract light incident adjacent to edges of color filters 530 and allow related pixels to receive the refracted light. Accordingly, an image sensor having reduced cross-talk and increased luminance efficiency may be provided.

Color filters 530 are provided over the first section 2 of the semiconductor layer 100. For example, the color filters 530 may be disposed on the second surface 1b of the semiconductor layer 100 and arranged to correspond to the photoelectric conversion devices PD in the first pixels PX1. The color filters 530 may cover the grid pattern 400 and the anti-reflection layer 300. The color filters 530 may include a high-refractive material having refractive index equal to or greater than about 1.5.

A color filter layer 540 is provided over the second section 4 of the semiconductor layer 100. For example, the color filter layer 540 may be disposed on the second surface 1b of the semiconductor layer 100 and may cover the photoelectric conversion devices PD in the second pixels PX2. The color filter layer 540 may cover the anti-reflection layer 300. The pads 520 are exposed by the color filters 530 and the color filter layer 540. Micro-lenses MR are provided on the color filters 530. The micro-lenses MR may be disposed to correspond to the photoelectric conversion devices PD in the first pixels PX1. The color filter layer 540 and the pads 520 are exposed by the micro-lenses MR.

Figure 6:
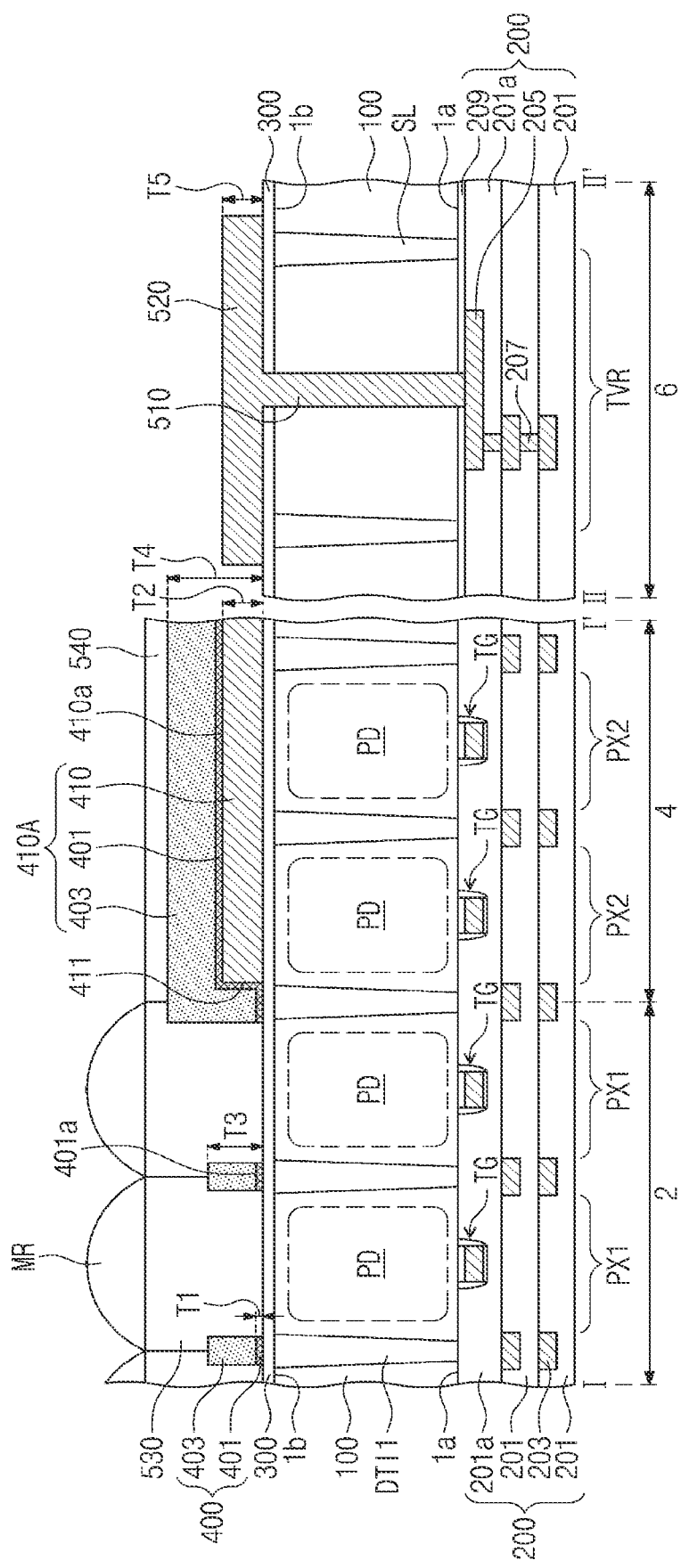
FIG. 6 illustrates a cross-sectional view taken along lines I-I' and II-II' of FIG. 4, showing an image sensor according to embodiments of the inventive concepts.

FIG. 6 illustrates a cross-sectional view taken along lines I-I' and II-II' of FIG. 4, showing an image sensor according to embodiments of the inventive concepts. Description of features in FIG. 6 that are the same as in FIG. 5 may hereinafter be omitted for brevity. The description provided hereinafter will be directed to features in FIG. 6 that are different than features described with respect to FIG. 5.

Referring to FIG. 6, a shield structure 410A is provided over the second section 4 of the semiconductor layer 100. For example, the shield structure 410A is disposed on the second surface 1b over the second section 4 of the semiconductor layer 100. The shield structure 410A covers the photoelectric conversion devices PD disposed in the second pixels PX2. The shield structure 410A includes a light-shield pattern 410, a first pattern 401, and a second pattern 403 that are sequentially stacked on the anti-reflection layer 300. The first pattern 401 disposed over the first section 2 may extend over the second section 4 of the semiconductor layer 100. The first pattern 401 covers the lateral surface 411 and the top surface 410a of the light-shield pattern 410. The first pattern 401 may be in contact with and connected to the light-shield pattern 410. Over the second section 4 of the semiconductor layer 100, the second pattern 403 disposed on the first pattern 401 may extend along the first pattern 401 over the second section 4 of semiconductor layer 100. The second pattern 403 covers lateral and top surfaces of the first pattern 401 disposed over the second section 4 of the semiconductor layer 100. For example, the grid pattern 400 may have a third thickness T3 that is less than a fourth thickness T4 of the shield structure 410A (T3<T4). The grid pattern 400 may have a top surface at a lower level than that of a top surface of the shield structure 410A, which level is a distance from the second surface 1b of the semiconductor layer 100. The pads 520 are exposed by the shield structure 410A, the color filter layer 540, and the micro-lenses MR. Each of the pads 520 may have a fifth thickness T5 less than the third thickness T3 of the grid pattern 400 and less than the fourth thickness T4 of the shield structure 410A (T5<T3, T5<T4). The fifth thickness T5 of the pad 520 may be substantially the same as the second thickness T2 of the light-shield pattern 410.

Figure 7:
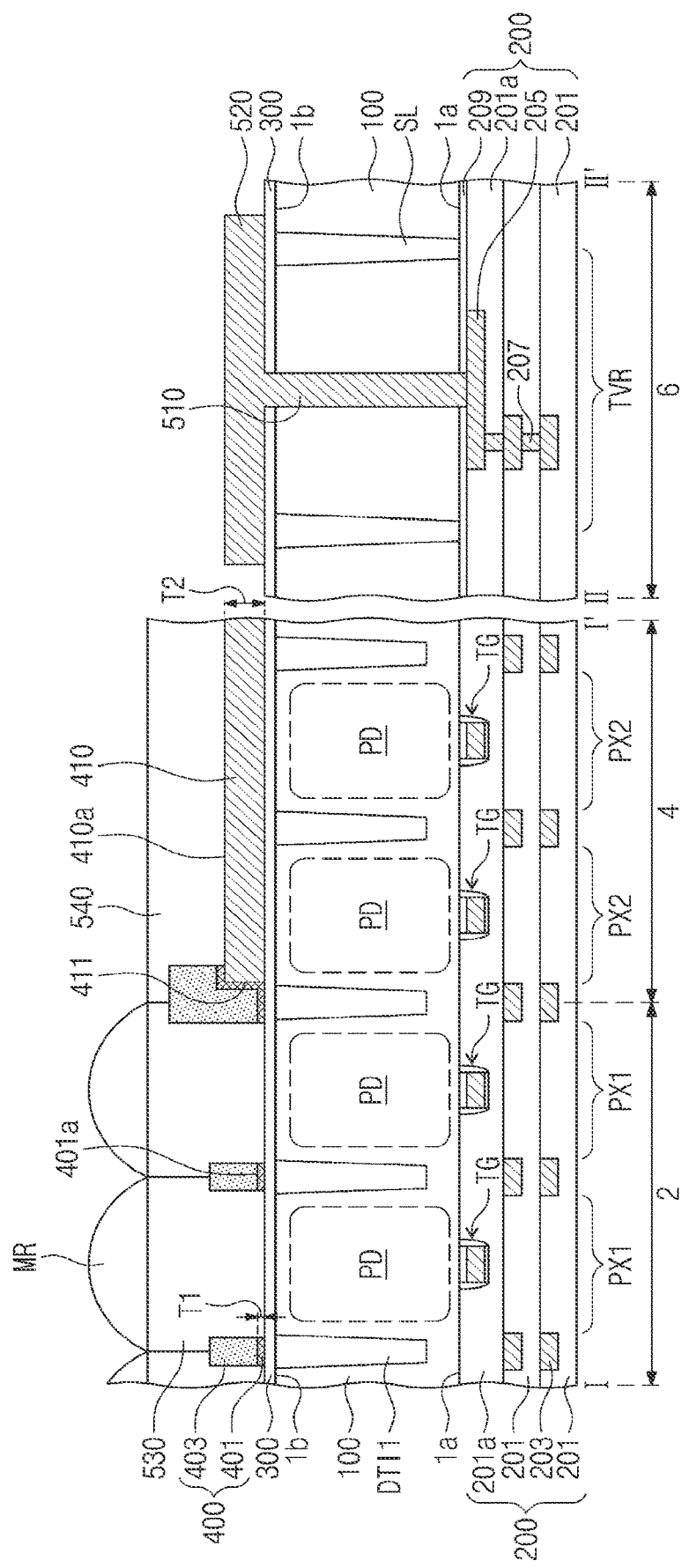
FIG. 7 illustrates a cross-sectional view taken along lines I-I' and II-II' of FIG. 4, showing an image sensor according to embodiments of the inventive concepts.

FIG. 7 illustrates a cross-sectional view taken along lines I-I' and II-II' of FIG. 4, showing an image sensor according to embodiments of the inventive concepts. Description of features in FIG. 7 that are the same as in FIG. 5 may hereinafter be omitted for brevity. The description provided hereinafter will be directed to features in FIG. 7 that are different than features described with respect to FIG. 5.

Referring to FIG. 7, the first device isolation layer DTI1 extends from the second surface 1b toward the first surface 1a in the semiconductor layer 100. The first device isolation layer DTI1 is spaced apart from the lowermost interlayer dielectric layer 201a of the wiring structure 200. For example, the first surface (i.e., the lower surface as shown in FIG. 7) of the first device isolation layer DTI1 is not coplanar with the first surface 1a of the semiconductor layer 100, and the second surface (i.e., the upper surface as shown in FIG. 7) of the first device isolation layer DTI1 is coplanar with the second surface 1b of the semiconductor layer 100. The first surface of the first device isolation layer DTI1 is located at a level between the first and second surfaces 1a and 1b of the semiconductor layer 100.

Figure 8:
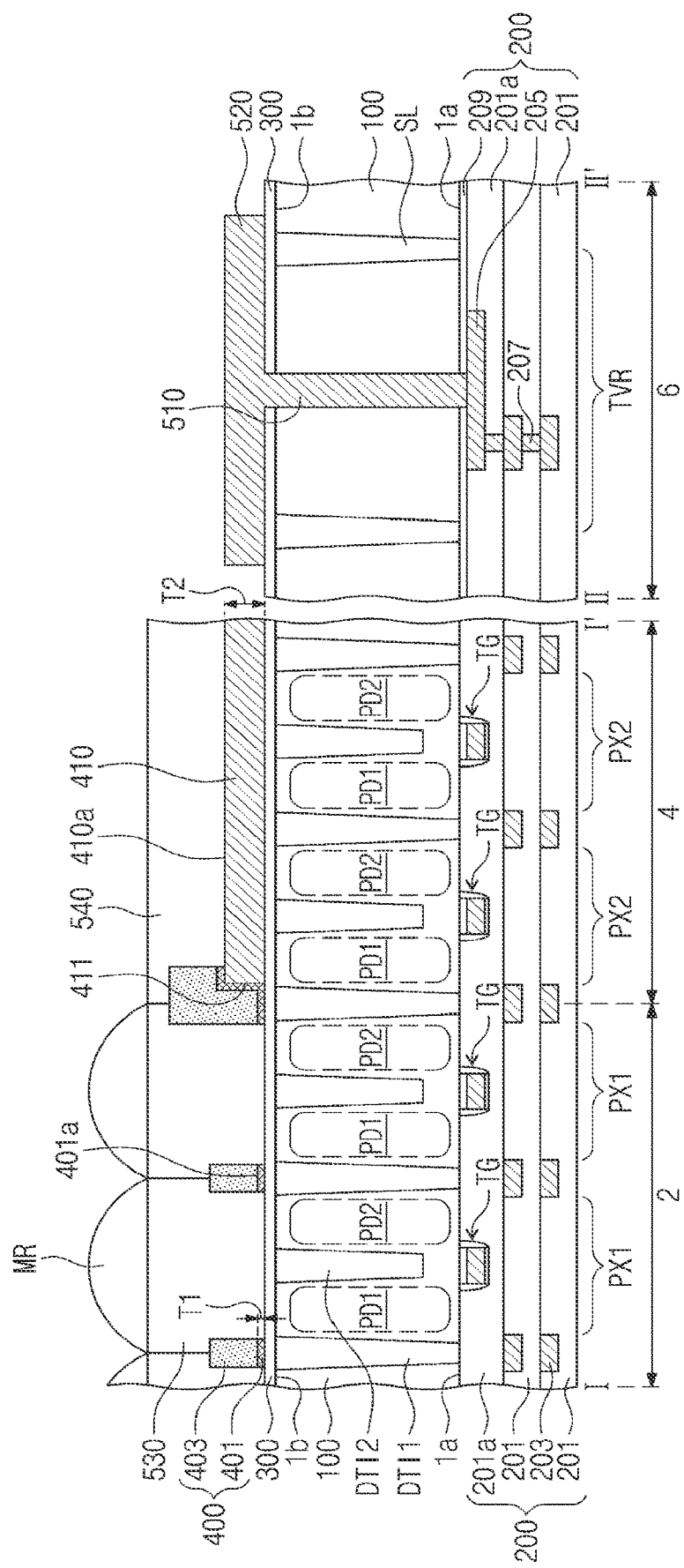
FIG. 8 illustrates a cross-sectional view taken along lines I-I' and II-II' of FIG. 4, showing an image sensor according to embodiments of the inventive concepts.

FIG. 8 illustrates a cross-sectional view taken along lines I-I' and II-II' of FIG. 4, showing an image sensor according to embodiments of the inventive concepts. Description of features in FIG. 8 that are the same as in FIG. 5 may hereinafter be omitted for brevity. The description provided hereinafter will be directed to features in FIG. 8 that are different than features described with respect to FIG. 5.

Referring to FIG. 8, first and second photoelectric conversion devices PD1 and PD2 are provided in each of the first and second pixels PX1 and PX2. For example, a pair of first and second photoelectric conversion devices PD1 and PD2 is disposed in each single one of the first and second pixels PX1 and PX2. Second device isolation layers DTI2 may be provided in each of the first and second pixels PX1 and PX2. The second device isolation layer DTI2 may be disposed between a pair of first and second photoelectric conversion devices PD1 and PD2 in each single one of the first and second pixels PX1 and PX2, physically separating the pair of first and second photoelectric conversion devices PD1 and PD2 from each other. In certain embodiments, although not shown, the second device isolation layers DTI2 are connected to the first device isolation layers DTI1. In other embodiments, the second device isolation layers DTI2 are not connected to the first device isolation layers DTI1. The second device isolation layers DTI2 extend from the second surface 1b toward the first surface 1a of the semiconductor layer 100. The second device isolation layers DTI2 are in contact with the second surface 1b of the semiconductor layer 100 and are spaced apart from the first surface 1a of the semiconductor layer 100. For example, the second device isolation layers DTI2 have first surfaces (i.e., lower surfaces as shown in FIG. 8) at a level between the first and second surfaces 1a and 1b of the semiconductor layer 100. The second device isolation layers DTI2 have second surfaces (i.e., upper surfaces as shown in FIG. 8) coplanar with the second surface 1b of the semiconductor layer 100. The second device isolation layers DTI2 may include, for example, one or more of a silicon oxide layer, a silicon nitride layer, and a dielectric layer such as $AlO_2$ or $HfO_2$.

Figure 9:
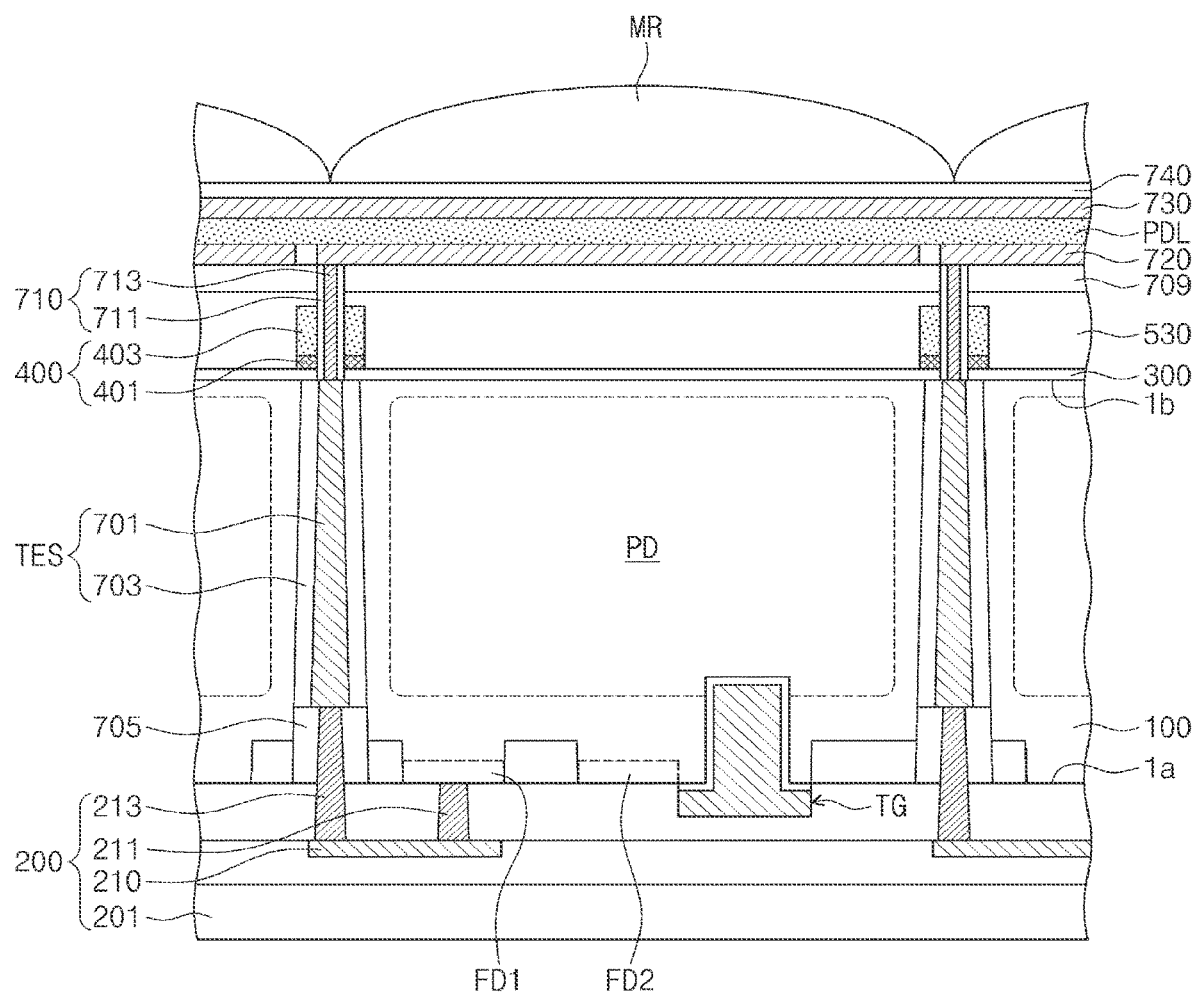
FIG. 9 illustrates a cross-sectional view of an image sensor according to embodiments of the inventive concepts.

FIG. 9 illustrates a cross-sectional view showing an image sensor according to embodiments of the inventive concepts.

Referring to FIG. 9, the semiconductor layer 100 is provided with a pair of first and second floating diffusion regions FD1 and FD2 therein. For example, the pair of first and second floating diffusion regions FD1 and FD2 are disposed in each of the first and second pixels (see PX1 and PX2 of FIG. 5) of the semiconductor layer 100. The first and second floating diffusion regions FD1 and FD2 may be disposed adjacent to the first surface 1a of the semiconductor layer 100. The second floating diffusion region FD2 is disposed in the semiconductor layer 100 on a side of the transfer gate TG. For example, different from the transfer gate TG of FIG. 5, the transfer gate TG of FIG. 9 has a portion buried in the semiconductor layer 100. Through electrode structures TES are disposed in the semiconductor layer 100. Although not shown, the through electrode structures TES may penetrate a portion of the first device isolation layer (see DTI1 of FIG. 5). Each of the through electrode structures TES may be provided to correspond to one of the first and second pixels PX1 and PX2. Each of the through electrode structures TES includes a through electrode 701 and a through dielectric pattern 703. The through dielectric pattern 703 may surround a sidewall of the through electrode 701. The through dielectric pattern 703 may include, for example, one or more of silicon oxide, silicon nitride, and silicon oxynitride. The through electrode 701 may include, for example, n-type doped polysilicon or p-type doped polysilicon.

A buried dielectric pattern 705 is disposed between each of the through electrode structures TES and the first surface 1a of the semiconductor layer 100. The buried dielectric pattern 705 has one surface (i.e., a lower surface as shown in FIG. 9) coplanar with the first surface 1a of the semiconductor layer 100. The buried dielectric pattern 705 may include, for example, one or more of a silicon oxide layer, a silicon nitride layer, and a silicon oxynitride layer.

The wiring structure 200 is disposed on the first surface 1a of the semiconductor layer 100. The wiring structure 200 includes a plurality of interlayer dielectric layers 201, a connection line 210, a first connection via 211, and a second connection via 213. The first connection via 211 is connected to the first floating diffusion region FD1, penetrating at least one of the interlayer dielectric layers 201. The second connection via 213 is connected to the through electrode 701 of the through electrode structure TES, penetrating the buried dielectric pattern 705 and at least one of the interlayer dielectric layers 201. The connection line 210 may be disposed on at least one of the interlayer dielectric layers 201 and connects the first and second connection vias 211 and 213 to each other. The connection line 210, the first connection via 211, and the second connection via 213 may for example include one or more of metals (e.g., tungsten, copper, or aluminum) and metal nitrides (e.g., tantalum nitride, titanium nitride, or tungsten nitride).

The grid pattern 400 is disposed on the second surface 1b of the semiconductor layer 100. The grid pattern 400 may be placed on the first device isolation layer (see DTI1 of FIG. 5) and the through electrode structure TES. The grid pattern 400 may be connected to the shield pattern (see 410 of FIG. 5). A dielectric layer 709 is disposed on the color filters 530. The dielectric layer 709 may cover top surfaces of the color filters 530. The dielectric layer 709 may include, for example, a silicon oxide layer, a silicon nitride layer, or a silicon oxynitride layer.

Contact plug structures 710 are disposed on the through electrode structures TES. The contact plug structures 710 penetrate the anti-reflection layer 300, the grid pattern 400, the color filters 530, and the dielectric layer 709. The contact plug structures 710 are connected to the through electrode structures TES. Each of the contact plug structures 710 includes a contact plug 713 and a spacer 711. The contact plug 713 penetrates the anti-reflection layer 300, the grid pattern 400, the color filters 530, and the dielectric layer 709. The spacer 711 may surround a sidewall of the contact plug 713. The contact plug 713 may include a metallic material, such as tungsten for example. The spacer 711 may include a dielectric material, such as a silicon oxide layer or a silicon nitride layer for example.

Bottom electrodes 720 may be provided on the dielectric layer 709. The bottom electrodes 720 may be disposed to correspond to the photoelectric conversion devices PD. The bottom electrodes 720 are spaced apart from each other. The contact plug structures 710 may be disposed to correspond to the bottom electrodes 720, and are electrically connected to the bottom electrodes 720. The bottom electrodes 720 may include a transparent conductive material. For example, the bottom electrodes 720 may include one or more of ITO (Indium Tin Oxide), IZO (Indium Zinc Oxide), ZnO (Zinc Oxide), and an organic transparent conductive material.

A photoelectric conversion layer PDL is disposed on the bottom electrodes 720. For example, the photoelectric conversion layer PDL may include an organic photoelectric conversion layer. The organic photoelectric conversion layer may include a p-type organic semiconductor material and an n-type organic semiconductor material, which p-type and n-type semiconductor materials may form a p-n junction. For example, the organic photoelectric conversion layer PDL may include quantum dots or chalcogenide.

A top electrode 730 is disposed on the photoelectric conversion layer PDL. The top electrode 730 may include a transparent conductive material. For example, the top electrode 730 may include one or more of ITO (Indium Tin Oxide), IZO (Indium Zinc Oxide), ZnO (Zinc Oxide), and an organic transparent conductive material.

A capping layer 740 is disposed on the top electrode 730. The capping layer 740 may include a dielectric material. For example, the capping layer 740 may include one or more of aluminum oxide, silicon oxide, silicon nitride, and silicon oxynitride.

The micro-lenses MR are provided on the capping layer 740.

Figure 10:
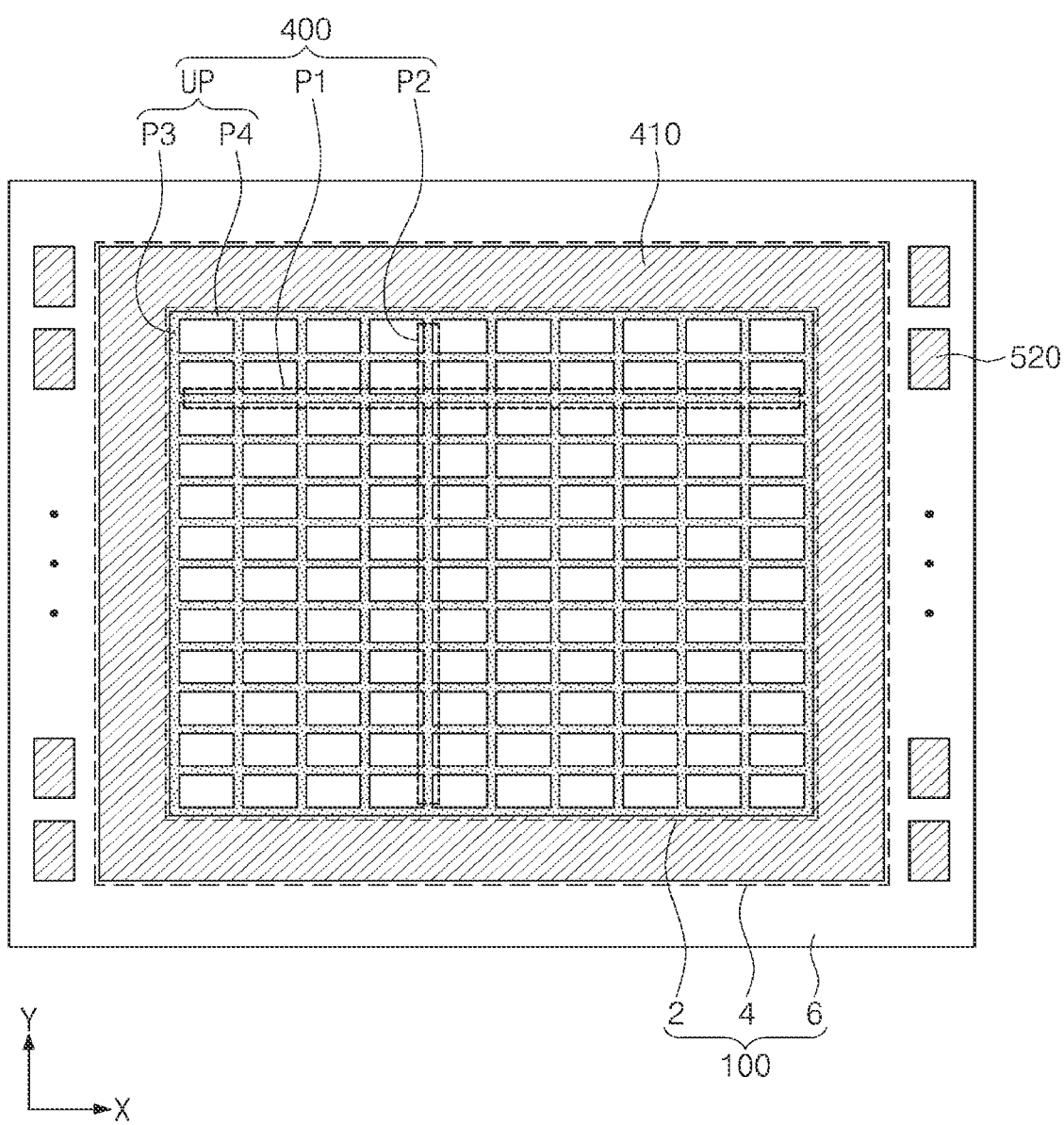
FIG. 10 illustrates a plan view of an image sensor according to embodiments of the inventive concepts.

FIG. 10 illustrates a plan view of an image sensor according to embodiments of the inventive concepts.

Referring to FIG. 10, the grid pattern 400 includes an outer segment UP, first segments P1, and second segments P2. The outer segment UP includes a pair of third segments P3 and a pair of fourth segments P4. The pair of third segments P3 extends in the second direction Y and are spaced apart from each other in the first direction X. The pair of fourth segments P4 extends in the first direction X and are spaced apart from each other in the second direction Y. The pair of third segments P3 has ends connected to ends of the pair of fourth segments P4. Therefore, the outer segment UP may have a rectangular ring shape. The first segments P1 and the second segments P2 are disposed inside the outer segment UP. The first segments P1 extend in the first direction X and are spaced apart from each other in the second direction Y. The second segments P2 extend in the second direction Y and are spaced apart from each other in the first direction X. The first and second segments P1 and P2 may be connected to the outer segment UP. The light-shield pattern 410 surrounds an outer sidewall of the outer segment UP of the grid pattern 400.

FIGS. 11A to 11D illustrate cross-sectional views taken along lines I-I' and II-II' of FIG. 4, showing a method of fabricating an image sensor according to embodiments of the inventive concepts.

Figure 11A:
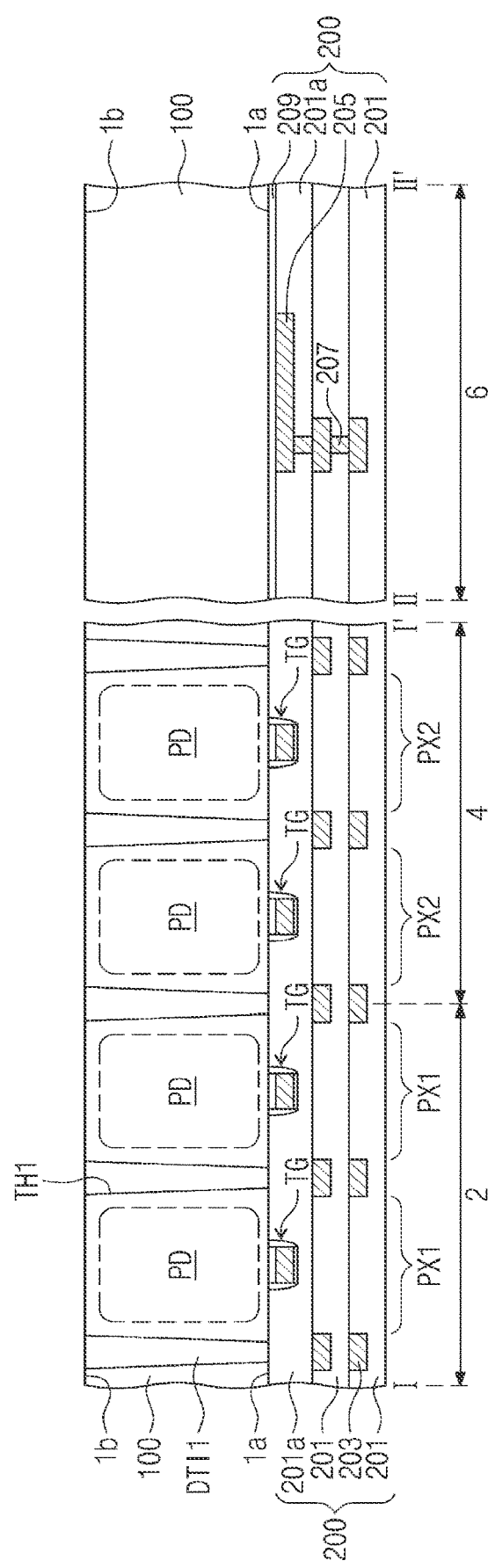
FIGS. 11A, 11B, 11C and 11D illustrate cross-sectional views taken along lines I-I' and II-II' of FIG. 4, showing a method of fabricating an image sensor according to embodiments of the inventive concepts.

Referring to FIG. 11A, a semiconductor layer 100 is provided. The semiconductor layer 100 has a first surface 1a and a second surface 1b that face each other. The semiconductor layer 100 includes a first section 2, a second section 4, and a third section 6. Photoelectric conversion devices PD are formed in the first and second sections 2 and 4 of the semiconductor layer 100. The photoelectric conversion devices PD may be formed by performing an ion implantation process in which impurities are implanted through the first surface 1a into the semiconductor layer 100. For example, the photoelectric conversion devices PD may be formed by implanting n-type impurities.

A wiring structure 200 is formed on the first surface 1a of the semiconductor layer 100. The wiring structure 200 includes transfer gates TG, interlayer dielectric layers 201 and 201a, first connection lines 203, second connection lines 205, vias 207, and a wiring dielectric layer 209. The transfer gates TG are formed on the first surface 1a over the first and second sections 2 and 4 of the semiconductor layer 100. The wiring dielectric layer 209 is formed on the first surface 1a over the third section 6 of the semiconductor layer 100. The interlayer dielectric layers 201 and 201a are sequentially formed on the first surface 1a of the semiconductor layer 100. A lowermost one 201a of the interlayer dielectric layers 201 and 201a covers the transfer gates TO and the wiring dielectric layer 209. The first and second connection lines 203 and 205 are disposed in the interlayer dielectric layers 201 and 201a. The first connection lines 203 are disposed over the first and second sections 2 and 4 of the semiconductor layer 100. The second connection lines 205 are disposed over the third section 6 of the semiconductor layer 100. The first and second connection lines 203 and 205 are covered with the interlayer dielectric layers 201 and 201a. The vias 207 are formed in the interlayer dielectric layers 201 and 201a. The vias 207 are disposed over the third section 6 of the semiconductor layer 100. The vias 207 may connect the second connection lines 205 to each other.

A first device isolation layer DTI1 is formed in the first and second sections 2 and 4 of the semiconductor layer 100. The first device isolation layer DTI1 may be formed by etching the semiconductor layer 100 to form a first trench TH1, and filling the first trench TH1 with a dielectric material and/or a conductive material. For example, as shown in figures, the first trench TH1 may be formed by etching the second surface 1b of the semiconductor layer 100. As another example, the first trench TH1 may be formed by etching the first surface 1a of the semiconductor layer 100 before forming the wiring structure 200. The first device isolation layer DTI1 may define first and second pixels PX1 and PX2 in the first and second sections 2 and 4 of the semiconductor layer 100. The first pixels PX1 are provided in the first section 2 of the semiconductor layer 100, and the second pixels PX2 may be provided in the second section 4 of the semiconductor layer 100. Photoelectric conversion devices PD are disposed in the first and second pixels PX1 and PX2.

Referring to FIG. JI B, a protective isolation layer SL is formed in the third section 6 of the semiconductor layer 100. The protective isolation layer SL may be formed by forming a second trench TH2 in the third section 6 of the semiconductor layer 100, and filling the second trench TH2 with a dielectric material. In certain embodiments, the second trench TH2 may be formed to penetrate the third section 6 of the semiconductor layer 100. The protective isolation layer SL may define a through via region TVR in the third section 6 of the semiconductor layer 100.

Figure 11B:
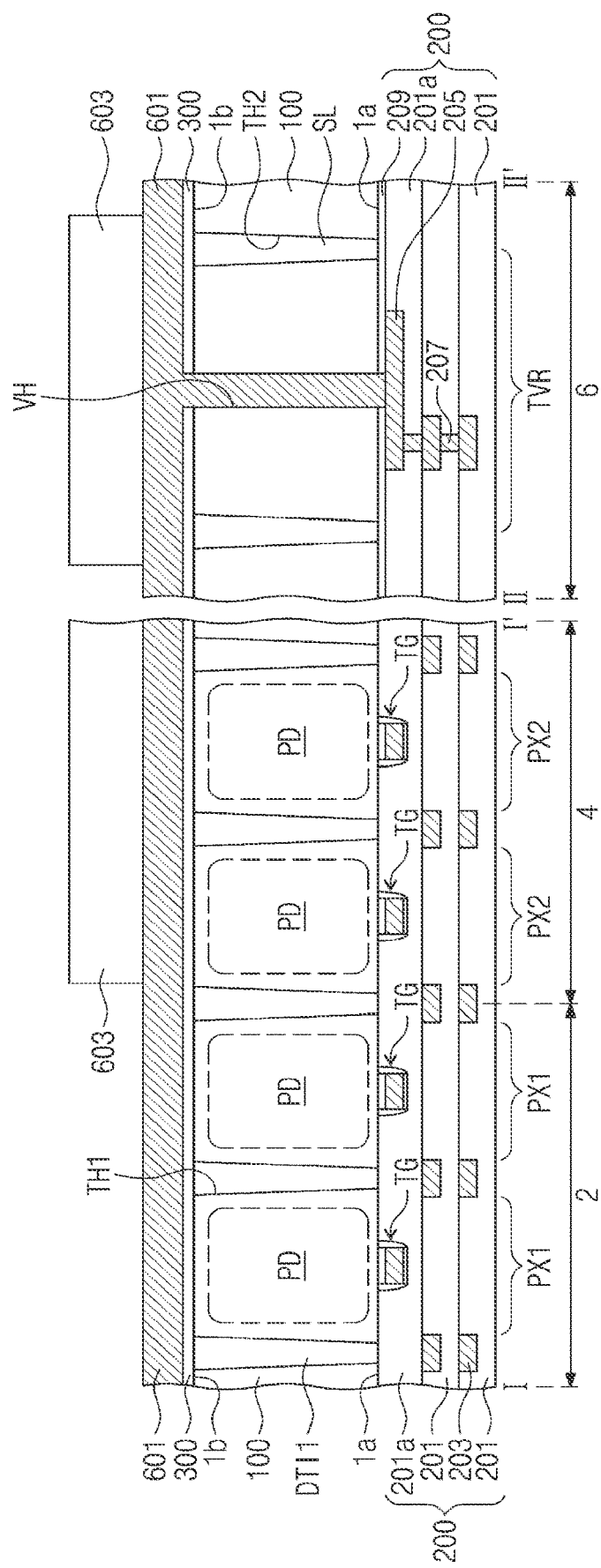

An anti-reflection layer 300 is formed on the second surface 1b of the semiconductor layer 100. The anti-reflection layer 300 covers the second surface 1b of the semiconductor layer 100, a second surface (i.e., an upper surface as shown in FIG. 11B) of the first device isolation layer DTI1, and a second surface (i.e., an upper surface as shown in FIG. 11B) of the protective isolation layer SL, which surfaces are exposed on the second surface 1b of the semiconductor layer 100. Although not shown, the anti-reflection layer 300 may fill the second trench TH2. Via holes VH are formed in the third section 6 of the semiconductor layer 100. For example, the via holes VH are formed in the through via region TVR of the semiconductor layer 100. The via holes VH may expose one or more of the second connection lines 205, penetrating the anti-reflection layer 300, the semiconductor layer 100, and the wiring dielectric layer 209.

A light-shield layer 601 is formed on the second surface 1b of the semiconductor layer 100. The light-shield layer 601 is formed over the first, second, and third sections 2, 4, and 6 of the semiconductor layer 100. The light-shield layer 601 fills the via holes VH and covers a top surface of the anti-reflection layer 300. The light-shield layer 601 may be formed to have a thickness of about 1500 Å to about 5000 Å. The light-shield layer 601 may include a metallic material, for example, tungsten (W). A first mask pattern 603 is formed on the light-shield layer 601. The first mask pattern 603 is formed over the second and third sections 4 and 6 of the semiconductor layer 100. For example, the first mask pattern 603 exposes the light-shield layer 601 formed over the first section 2 of the semiconductor layer 100 and also exposes portions of the shield layer 601 formed over the third section 6 of the semiconductor layer 100. The first mask pattern 603 may include, for example, a photoresist material.

Figure 11C:
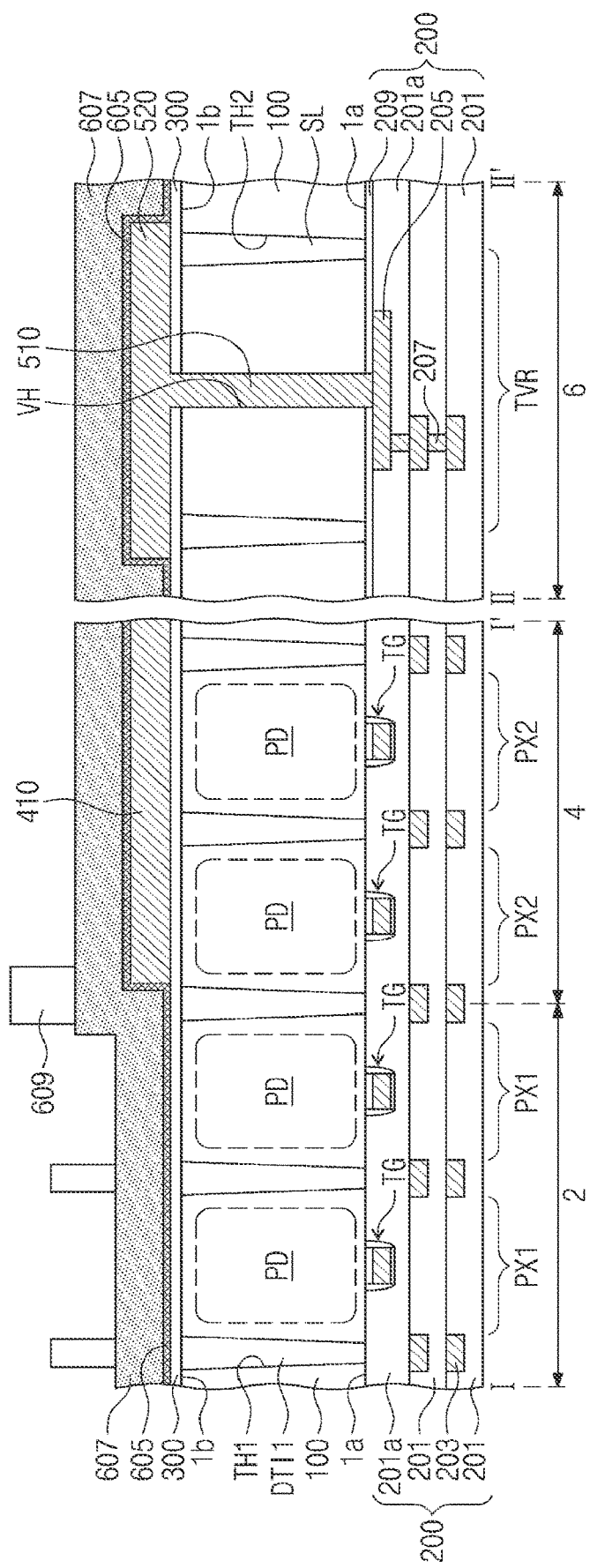

Referring to FIG. 11C, an etching process is performed in which the first mask pattern 603 is used as an etching mask to etch the light-shield layer 601. Therefore, a light-shield pattern 410 is formed over the second section 4 of the semiconductor layer 100, and pads 520 and through vias 510 are formed over/in the third section 6 of the semiconductor layer 100. The light-shield pattern 410 exposes a top surface of the anti-reflection layer 300 formed over the first section 2 of the semiconductor layer 100. The light-shield pattern 410 covers a top surface of the anti-reflection layer 300 formed over the second section 4 of the semiconductor layer 100. The through vias 510 are formed in the via holes VH, and the pads 520 are formed on the through vias 510. For example, the pads 520 may be formed spaced apart from each other, and at least one of the pads 520 may be connected to the light-shield pattern 410. As another example, the pads 520 may be formed spaced apart from each other, and the pads 520 may not be connected to the light-shield pattern 410. The etching process may be a dry etching process. After the etching process, a remaining first mask pattern 603 is removed. The first mask pattern 603 may be removed by performing an ashing process or a strip process.

A film layer 605 is formed on the second surface 1b of the semiconductor layer 100. The film layer 605 covers the top surface of the anti-reflection layer 300 formed over the first section 2 of the semiconductor layer 100, top and lateral surfaces of the light-shield pattern 410 formed over the second section 4 of the semiconductor layer 100, and top and lateral surfaces of the pads 520 formed over the third section 6 of the semiconductor layer 100. The film layer 605 may be formed to have a thickness less than that of the light-shield pattern 410. The film layer 605 may be formed to have a thickness of, for example, about 100 Å to about 1500 Å. The film layer 605 may include, for example, one or more of titanium (Ti), titanium nitride (TiN), tungsten (W), aluminum (Al), and copper (Cu). A low-refractive layer 607 is formed on the film layer 605. The low-refractive layer 607 covers top and lateral surfaces of the film layer 605. The low-refractive layer 607 may include a low-refractive material with a refractive index equal to or less than about 1.4.

A second mask pattern 609 is formed on the low-refractive layer 607. The second mask pattern 609 is formed over the first and second sections 2 and 4 of the semiconductor layer 100. The second mask pattern 609 is formed to overlap the first device isolation layer DTI1 formed in the first section 2 of the semiconductor layer 100. The second mask pattern 609 is formed along the first device isolation layer DTI1 formed in the first section 2 of the semiconductor layer 100. For example, the second mask pattern 609 may expose portions of the low-refractive layer 607 formed over the first section 2 of the semiconductor layer 100, a portion of the low-refractive layer 607 formed over the second section 4 of the semiconductor layer 100, and the entirety of the low-refractive layer 607 formed over the third section 6 of the semiconductor layer 100. As another example, the second mask pattern 609 may expose portions of the low-refractive layer 607 formed over the first section 2 of the semiconductor layer 100 and the entirety of the low-refractive layer 607 formed over the third section 6 of the semiconductor layer 100. In this case, the second mask pattern 609 may cover an entire top surface of the low-refractive layer 607 formed over the second section 4 of the semiconductor layer 100. The second mask pattern 609 may include, for example, a photoresist material.

Figure 11D:
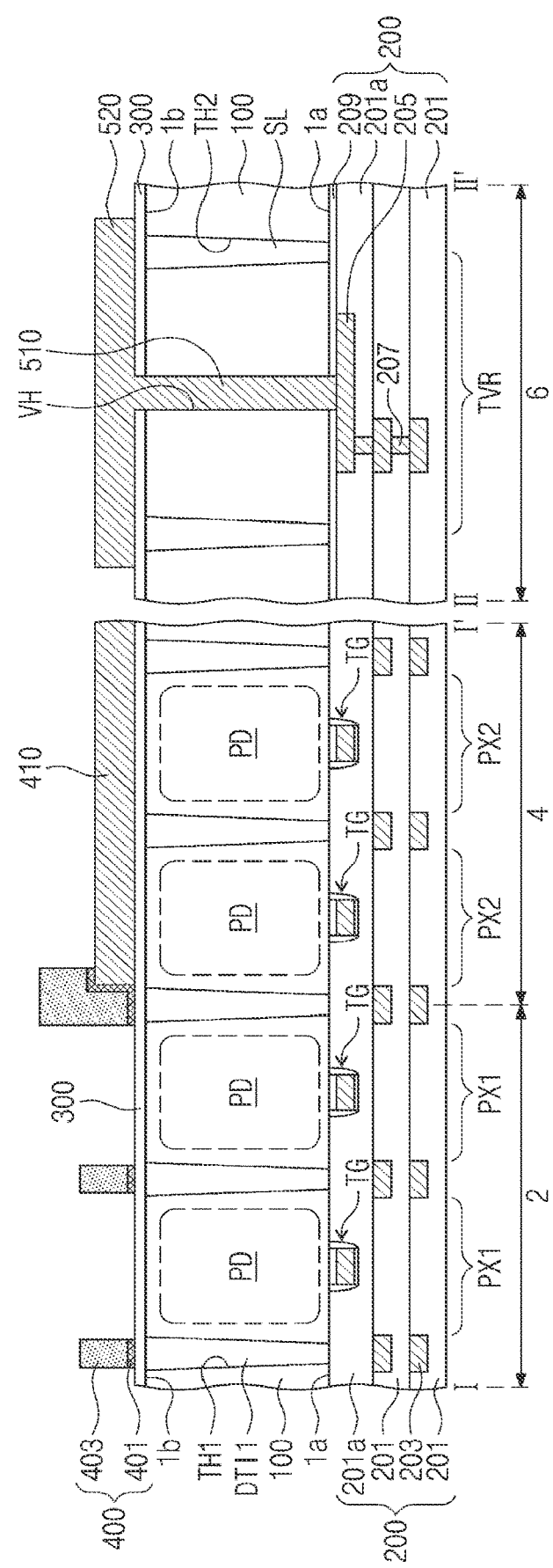

Referring to FIG. 11D, an etching process is performed in which the second mask pattern 609 is used as an etching mask to etch the low-refractive layer 607 and the film layer 605. Therefore, a grid pattern 400 is formed over the first section 2 of the semiconductor layer 100. The grid pattern 400 is formed to overlap the first device isolation layer DTI1 formed in the first section 2 of the semiconductor layer 100. The grid pattern 400 exposes the photoelectric conversion devices PD formed in the first pixels PX1. The grid pattern 400 may cover the lateral surface and a portion of the top surface of the light-shield pattern 410, which lateral and top surfaces of the light-shield pattern 410 are adjacent to the first section 2 of the semiconductor layer 100. The grid pattern 400 includes a first pattern 401 and a second pattern 403. The first pattern 401 is formed from the patterned film layer 605, and the second pattern 403 is formed from the patterned low-refractive layer 607. The first pattern 401 may cover the lateral surface and the portion of the top surface of the light-shield pattern 410. The top surfaces of the pads 520 are exposed by the grid pattern 400. The etching process may be a dry etching process. After the etching process, a remaining second mask pattern 609 may be removed. The second mask pattern 609 is removed by performing an ashing process or a strip process.

Referring back to FIG. 5, color filters 530 are formed on the second surface 1b of the semiconductor layer 100. The color filters 530 may be formed to correspond to the photoelectric conversion devices PD formed in the first pixels PX1. A color filter layer 540 is formed on the second surface 1b of the semiconductor layer 100. The color filter layer 540 may be formed over the second section 4 of the semiconductor layer 100, covering the light-shield pattern 410. The color filters 530 and the color filter layer 540 expose the pads 520 formed over the third section 6 of the semiconductor layer 100. Micro-lenses MR are formed on the color filters 530.

According to example embodiments of the inventive concepts, a grid pattern may be formed to have a stack structure different from that of a light-shield pattern. The grid pattern may include a first pattern that includes a metallic material and is thinner than the light-shield pattern, and as a result, the first pattern may minimize light absorption, while serving as a pathway through which electrostatic discharge is exhausted out. The grid pattern may include a second pattern formed of a low-refractive material, and thus the second pattern may refract light incident adjacent to edges of color filters and allow related pixels to receive the refracted light. Accordingly, an image sensor having reduced cross-talk and increased luminance efficiency may be provided.

Although the inventive concepts have been described in connection with some example embodiments illustrated in the accompanying drawings, it should be understood to those skilled in the art that various changes and modifications may be made without departing from the technical spirit and features of the inventive concepts. It should be apparent to those skilled in the art that various substitution, modifications, and changes may be made to the disclosed embodiments without departing from the scope and spirit of the inventive concepts.

What is claimed is:

1. An image sensor, comprising:
   a semiconductor layer including a first section and a second section around the first section, the semiconductor layer having a first surface and a second surface that face each other;
   a device isolation layer in the semiconductor layer and defining a plurality of pixels;
   a grid pattern on the first surface of the semiconductor layer and over the first section of the semiconductor layer, the grid pattern including at least two layers comprising a metal layer and an organic material layer;
   a light-shield pattern on the first surface of the semiconductor layer and over the second section of the semiconductor layer; and
   a color filter on the first surface of the semiconductor layer;
   wherein the organic material layer is disposed on the metal layer and on the light-shield pattern, and
   wherein the organic material layer on the light-shield pattern at least partially covers a lateral surface and a top surface of the light-shield pattern, and extends along the lateral surface and the top surface of the light-shield pattern.

2. The image sensor of claim 1, wherein a thickness of the grid pattern is greater than a thickness of the light-shield pattern.

3. The image sensor of claim 1, wherein a thickness of the metal layer is less than a thickness of the light-shield pattern.

4. The image sensor of claim 1, wherein the metal layer includes Ti and the light-shield pattern includes W.

5. The image sensor of claim 1, wherein a refractive index of the organic material layer is less than 1.4.

6. The image sensor of claim 1, further comprising:
an anti-reflection layer on the first surface of the semiconductor layer and on the device isolation layer and the plurality of pixels,
wherein the grid pattern, the light-shield pattern and the color filter are on the anti-reflection layer, and
wherein the anti-reflection layer includes at least one of a hafnium oxide layer and an aluminum oxide layer.

7. The image sensor of claim 1, wherein the semiconductor layer further includes a pad section including a plurality of pads for interconnecting the image sensor with an external device,
wherein the metal layer of the grid pattern is electrically connected to at least one of the pads via the light-shielding pattern and a connection line disposed on the second surface of the semiconductor layer.

8. The image sensor of claim 1, wherein the pixels comprise:
a plurality of first pixels in the first section of the semiconductor layer; and
a plurality of second pixels in the second section of the semiconductor layer,
the image sensor further comprising a plurality of first photoelectric conversion devices in the first pixels, and a plurality of second photoelectric conversion devices in the second pixels,
wherein the grid pattern is vertically overlapped with the device isolation layer, and the light-shield pattern vertically overlapped with the second photoelectric conversion devices.

9. The image sensor of claim 1, wherein the metal layer covers the lateral surface of the light-shield pattern and is sandwiched between the lateral surface of the light-shield pattern and the organic material layer.

10. An image sensor, comprising:
a semiconductor layer including a first section and a second section around the first section, the semiconductor layer having a first surface and a second surface that face each other;
a device isolation layer in the semiconductor layer and defining a plurality of pixels;
an anti-reflection layer on the first surface of the semiconductor layer and on the device isolation layer and the plurality of pixels;
a grid pattern on the anti-reflection layer over the first section, the grid pattern including at least two layers comprising a metal layer and an organic material layer; and
a light-shield pattern on the anti-reflection layer over the second section,
wherein the organic material layer is disposed on the metal layer and on the light-shield pattern, and
wherein the organic material layer on the light-shield pattern at least partially covers a lateral surface and a top surface of the light-shield pattern, and extends along the lateral surface and the top surface of the light-shield pattern.

11. The image sensor of claim 10, wherein a thickness of the grid pattern is greater than a thickness of the light-shield pattern.

12. The image sensor of claim 11, wherein a thickness of the metal layer is less than the thickness of the light-shield pattern.

13. The image sensor of claim 12, wherein a thickness of the organic material layer is greater than the thickness of the metal layer.

14. The image sensor of claim 10, wherein the metal layer includes Ti and the light-shield pattern includes W.

15. The image sensor of claim 10, further comprising a color filter on the grid pattern,
wherein the organic material layer has a refractive index lower than that of the color filter.

16. The image sensor of claim 15, wherein the refractive index of the organic material layer is less than 1.4.

17. The image sensor of claim 10, wherein the metal layer covers the lateral surface of the light-shield pattern and is sandwiched between the lateral surface of the light-shield pattern and the organic material layer.

18. An image sensor, comprising:
a semiconductor layer including a first section and a second section around the first section, the semiconductor layer having a first surface and a second surface that face each other;
a device isolation layer in the semiconductor layer and defining a plurality of pixels;
a grid pattern on the first surface of the semiconductor layer over the first section and on the device isolation layer, the grid pattern including at least two layers comprising a metal layer and an organic material layer; and
a light-shield pattern on the first surface of the semiconductor layer over the second section,
wherein the organic material layer is disposed on the metal layer and on the light-shield pattern, and
wherein the organic material layer on the light-shield pattern at least partially covers a lateral surface and a top surface of the light-shield pattern, and extends along the lateral surface and the top surface of the light-shield pattern.

19. The image sensor of claim 18, further comprising a color filter on the first surface of the semiconductor layer over the first section and on the grid pattern.

20. The image sensor of claim 18, wherein a thickness of the grid pattern is greater than a thickness of the light-shield pattern.

* * * * *